United States Patent [19]

Rector et al.

[11] Patent Number: 4,721,870
[45] Date of Patent: Jan. 26, 1988

[54] FILTERING OF ELECTROMAGNETIC INTERFERENCE FROM A DIGITAL SIGNAL

[75] Inventors: Stephen W. Rector, Washington; Gwenne A. E. Henricks, East Peoria, both of Ill.

[73] Assignee: Caterpillar Inc., Peoria, Ill.

[21] Appl. No.: 915,214

[22] Filed: Oct. 3, 1986

[51] Int. Cl.$^4$ .......................... H03B 1/00; H03H 7/01; H03H 7/02

[52] U.S. Cl. .................... 307/520; 328/167; 333/172; 333/167; 307/521

[58] Field of Search ............... 307/520, 521; 328/167; 333/172, 167

[56] References Cited

U.S. PATENT DOCUMENTS

| | | | |
|---|---|---|---|
| 2,588,291 | 3/1952 | Ricker | 333/172 |
| 2,890,420 | 6/1959 | Bradburd | 333/172 |
| 3,564,146 | 2/1971 | Poschenrieder | 333/167 |
| 3,716,729 | 2/1973 | Rollett | 328/167 |
| 3,883,833 | 5/1975 | Ozone et al. | 333/167 |

OTHER PUBLICATIONS

Electronics Designers' Handbook, Giacoletto, L. J., McGraw-Hill Book Co., 1977, pp. 6-12.
VLSI System Design, Murgoda, Saburo, John Wiley & Sons, pp. 138-139.

*Primary Examiner*—Stanley D. Miller
*Assistant Examiner*—Trong Quang Phan
*Attorney, Agent, or Firm*—Robert E. Muir

[57] ABSTRACT

An apparatus for filtering radio frequency interference from digital signals. The filter uses a resistor, an inductor and a capacitor to provide a filter with a broad bandwidth capable of passing high frequency digital signals, while severely attenuating radio frequencies coupled to the digital signals. The filter is used primarily in conjunction with an electronic control to filter input signals to the control from remote sensors.

11 Claims, 9 Drawing Figures

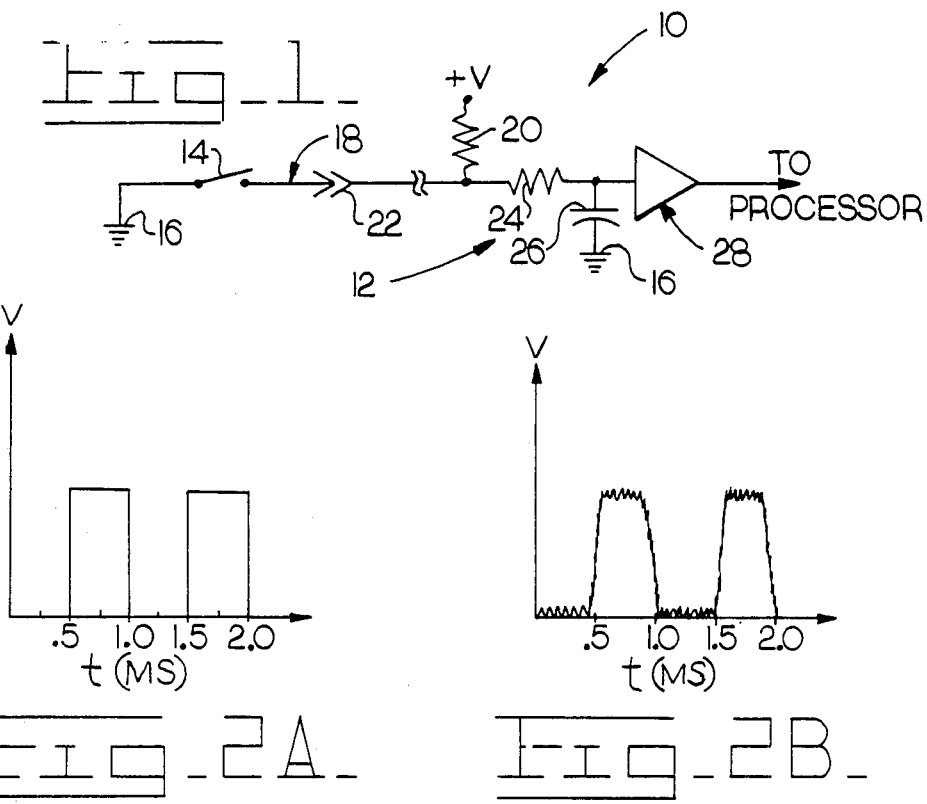
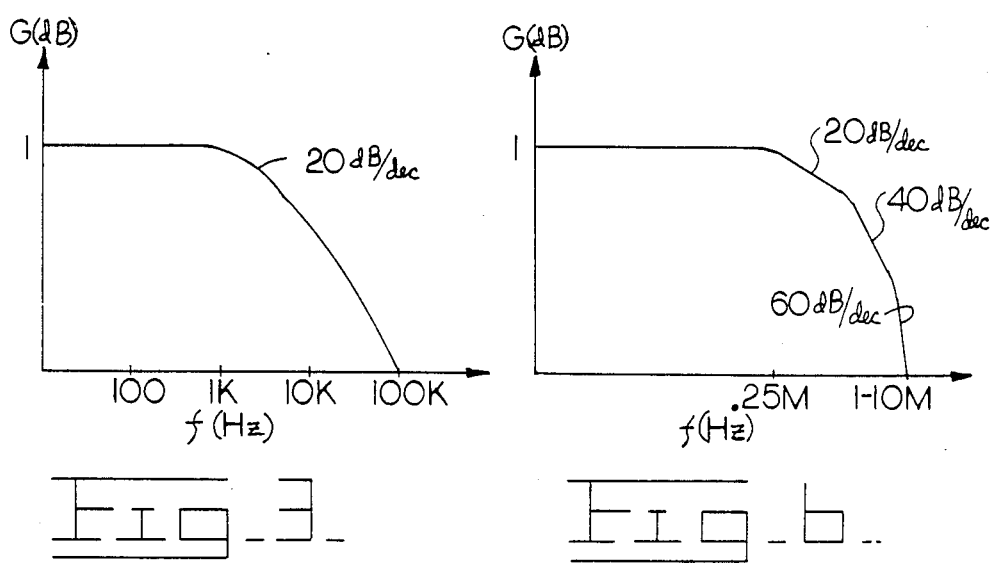

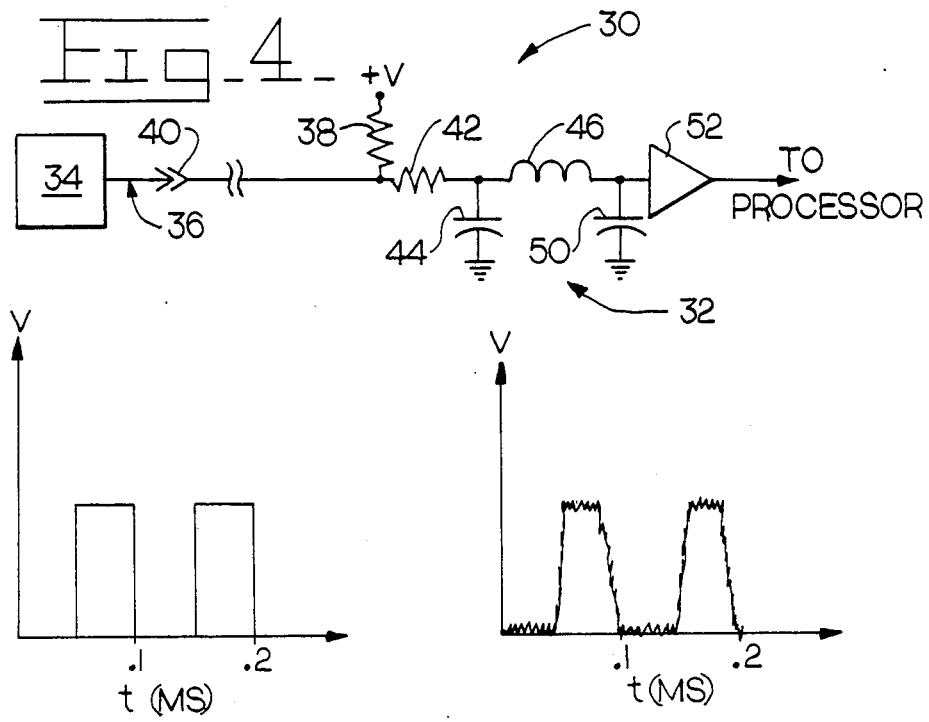
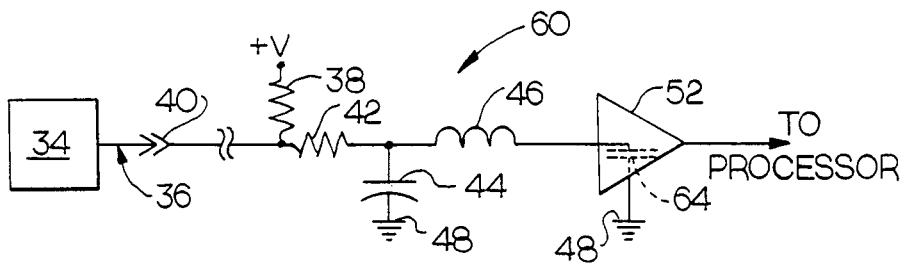

FILTERING OF ELECTROMAGNETIC INTERFERENCE FROM A DIGITAL SIGNAL

DESCRIPTION

1. Technical Field

This invention relates generally to the filtering of electromagnetic radiation from a received signal and more particularly to the filtering of radio frequency interference from a digital input signal.

2. Background Art

In an electronic control system, signals from various sources are typically input to a central unit. Sources, such as electrical transducers, usually deliver analog signals; sources, such as mechanical switches, deliver digital signals. Since these signals represent a measurement of a desired parameter, accuracy of the input signals is needed for optimum control. Transmission of analog signals is undesirable due to signal drift and losses in the transmission lines. Therefore, analog signals are converted to digital signals and then sent to the central unit.

However, electromagnetic interference couples with the signals during transmission to the central unit. This interference, particularly radio frequencies, contaminates the intended signals and causes transmission errors. Therefore, the signals must be filtered just before reception by the central unit in order to receive "clean" signals.

A simple RC one-pole lowpass filter, as is well-known in the art, satisfactorily filters out radio frequency interference from a low frequency digital signal. For example, FIG. 1 illustrates a typical arrangement using a mechanical switch and an RC filter. However, a filter of this kind typically has a bandwidth less than 1K hertz. While it works well with a mechanical switch, which provides a low frequency digital input, it cannot be used effectively with a digital input having a frequency in the kilohertz range or higher.

As previously stated, many analog signals are converted to digital signals before transmission. The sampling rate needed for some of these conversions results in digital signals approaching 10K hertz or more. Efforts to increase the bandwidth of the one-pole circuit shown in FIG. 1 decreases the attenuation of the higher frequency components. Therefore, the filter passes the higher frequency digital signal of about 10K hertz, but cannot effectively filter out the radio frequencies of about 1M-200M hertz.

It is clear that the RC filter with proper attenuation and a narrow bandwidth will not pass a high frequency digital signal. Likewise, if the RC filter is adjusted to pass the high frequency digital signal, it cannot effectively attenuate the radio frequency interference.

The present invention is directed to overcoming one or more of the problems set forth above.

DISCLOSURE OF THE INVENTION

In one aspect of the present invention, an apparatus filters a digital signal. A resistor has first and second terminals. An inductor has first and second terminals with the first terminal connected to the second terminal of the resistor. A first capacitor has a first terminal connected to the junction formed by the connection of the resistor and the inductor and has a second terminal connected to a circuit ground. A second capacitor has a first terminal connected to the second terminal of the inductor and has a second terminal connected to the circuit ground.

In another aspect of the present invention, an apparatus filters a digital signal. A current limiting resistor has first and second terminals. An inductor has first and second terminals with the first terminal connected to the second terminal of the resistor, thus forming a junction. A capacitor has a first terminal connected to the junction of the resistor and inductor. The capacitor's second terminal is connected to a circuit ground. A metal oxide semiconductor gate input is connected to the second terminal of the inductor.

The technical problem involves the filtering of electromagnetic interference from digital signals. Electromagnetic radiation, especially radio waves, cause errors in electronic systems and in signal transmission. For instance, when sending a data signal via a wire to an electronic control, the wire acts as an antenna. In a "noisy" environment, the wire receives a significant amount of radiation, which interferes with the data signal, thus producing errors. Therefore, the data signals must be filtered at a location physically near the electronic control. Such a filter must pass all information in the signal, while blocking the noise and interference. As the frequency of digital signals increases, the filtering of higher frequency components, such as radio frequencies, becomes more difficult. Filters must provide wider usable bandwidths and steeper high frequency attenuation.

Multiple pole filters must be employed, since the bandwidth and attenuation characteristics of such filters can be tuned to specific applications. A traditional single-pole RC filter, as discussed earlier, cannot supply adequate bandwidth and attenuation for high frequency digital signals. However, a filter, constructed as described in the first paragraph of this section, yields three poles, since three energy storage elements are used. The three-pole filter widens the bandwidth while causing steeper attenuation of higher frequencies. Selecting the appropriate values for the inductance and capacitances tunes the filter to pass desired digital signals and reject radio frequencies.

Furthermore, a metal oxide semiconductor gate is used to provide the second capacitance, which constitutes the third pole. A property of metal oxide semiconductor gates, which is explained in most semiconductor reference books, is a small capacitance between the metal and substrate surfaces. This capacitance serves in place of a discrete capacitor, and thus saves in filter cost. This is a mag or concern when the number of digital inputs to a circuit is high. Additionally, the value of the metal oxide semiconductor gate capacitance is so low that when a smaller first capacitor is used, the filter exhibits a negligible phase shift.

BRIEF DESCRIPTION OF THE DRAWINGS

FIG. 1 illustrates a diagrammatic view of a lowpass filter for a low frequency digital input signal;

FIGS. 2A-2B illustrate an example of low frequency digital signals;

FIG. 3 illustrates a diagrammatic view of one example of the frequency response of an RC filter;

FIG. 4 illustrates a diagrammatic view of an electromagnetic radiation filter for a high frequency digital signal;

FIGS. 5A-5B illustrate an example of high frequency digital signals;

FIG. 6 illustrates a diagrammatic view of one example of the frequency response of an electromagnetic interference filter; and FIG. 7 illustrates a diagrammatic view of an electromagnetic radiation filter for a high frequency digital signal, the filter including a metal oxide semiconductor gate.

BEST MODE FOR CARRYING OUT THE INVENTION

FIG. 1 illustrates a signal transmission apparatus 10, which uses a one-pole RC lowpass filter 12. A digital signal, shown in FIG. 2A, is generated by a switch 14, which is connected between a circuit ground 16 and a transmission line 18. The transmission line 18 is connected via a first resistor 20, having first and second terminals, to the positive voltage reference. A connector pin 22 is inserted into the transmission line 18. A second resistor 24, having first and second terminals, is connected via its first terminal to the second terminal of the first resistor 20. The second terminal of the second resistor 24 is connected to the first terminal of a capacitor 26 and to the input of a metal oxide semiconductor gate 28. The second terminal of the capacitor 26 is connected to the circuit ground 16.

When the switch 14 opens, no current can flow through the first resistor 20 to ground 16. Therefore, the voltage drop across the first resistor 20 is zero and the reference voltage appears at the second terminal of the first resistor 20. A "high" voltage is present on the first terminal of the second resistor 24, the input to the RC filter 12. When the switch 14 closes, current flows through the first resistor 20 to ground 16. Substantially all of the reference voltage is dropped across the first resistor 20, leaving the first terminal of the second resistor 24 at a "low" voltage level. The first resistor 20 also provides a "high" voltage reference to the RC filter 12 if a fault occurs, such as connector pin 22 disconnecting.

The transmission line 18 receives electomagnetic radiation much the same as an antenna. This radiation interferes with the digital signal, as shown in FIG. 2B. The RC filter 12 exhibits a frequency response similar to that shown in FIG. 3. As can be seen, a digital signal with a frequency of 1K Hz or less can pass with no attenuation from the filter. However, the higher frequencies, 1M Hz to 200M Hz, associated with radio frequency radiation, are severely attenuated or blocked. Therefore, an RC filter 12 effectively blocks radio frequency radiation on a low frequency digital signal. But it is obvious that a higher frequency digital signal would be attenuated using a filter of this type.

FIG. 4 illustrates a preferred embodiment of the electromagnetic interference filter 32 used in a signal transmission apparatus 30. A digital signal, shown in FIG. 5A, is generated by a digital signal generating means 34. The digital signal is output to transmission line 36, which connects the signal generating means to the positive voltage reference via a pull-up resistor 38. A connector pin 40 is inserted into the transmission line 36. A current limiting resistor 42, having first and second terminals, is connected at its first terminal to the second terminal of the pull-up resistor 38. The second terminal of the current limiting resistor 42 is connected to the first terminal of a first capacitor 44 and to the first terminal of an inductor 46, thus forming a junction. The second terminal of the first capacitor 44 is connected to a circuit ground 48. The second terminal of the inductor 46 is connected to the first terminal of a second capacitor 50 and to the input of a metal oxide semiconductor gate 52. The second terminal of the second capacitor 50 is connected to the circuit ground 48.

The apparatus 30 functions similar to the apparatus 10 described in FIG. 1. The differences include a high frequency digital signal generating means 34 and a three-pole filter 32, as opposed to a single-pole RC filter 12. The transmission line 36 receives electromagnetic interference much the same as an antenna. This radiation interferes with the digital signal, as shown in FIG. 5B. Digital input signals are receivable on the first terminal of the current limiting resistor 42, which buffers the filter 32 from high currents.

The three-pole filter 32 exhibits a frequency response similar to that shown in FIG. 6. As can be seen, a digital signal with a frequency of 0.25M Hz or less is transmitted by the filter with no attenuation. However, the higher frequencies, 1M Hz to 200M Hz, associated with radio frequencies, are severely attenuated or blocked by the filter 32. In effect, the addition of two more energy storing devices, the inductor 46 and the second capacitor 50, increases the usable bandwidth and increases the attenuation of electromagnetic interference frequencies.

By looking at the impedance of the inductor 46 and the capacitors 44,50 at different frequencies lends insight to the operation of the filter 32. The impedances are listed below with respect to frequency:

$$Z_{IND} = 2\pi fL \quad Z_{CAP} = \frac{1}{2\pi fC}$$

At low frequencies, the impedance of the capacitors 44,50 is very high and the impedance of the inductor 46 is very low. Therefore, at low frequencies, the capacitors 44,50 do not allow signals to pass through them to ground, since the path they provide impedes the signal. Conversely, the inductor exhibits a very small impedance at low frequencies, so low frequency signals are passed freely.

Using the same equations at high frequencies, the impedance of capacitors 44,50 is very low, and the impedance of the inductor 46 is very high. Therefore, the capacitors 44,50 pass substantially all of the high frequency radiation to circuit ground 48. The inductor 46 blocks the passage of higher frequencies, such as radio frequencies, thus forcing the energy at higher frequencies to pass through the capacitors 44,50.

Of course, the values of capacitance and inductance are chosen such that radio frequency radiation causes the capacitors 44,50 to attain an impedance sufficiently lower than the impedance of the inductor 46 such that the capacitors 44,50 transmit substantially all of the radio frequency radiation to circuit ground 48. Furthermore, the values of the capacitance and the inductance are selected to substantially prevent a phase shift of the digital signal from the first terminal of the first capacitor 44 to the input of the metal oxide semiconductor gate 52.

Referring now to FIG. 7, wherein another embodiment of the electromagnetic interference filter 62 is illustrated in a signal transmission apparatus 60. This circuit functions substantially the same as the apparatus 30, described in FIGS. 4, 5, and 6. This is deceiving due to the absence of the second capacitor 50. However, the metal oxide semiconductor gate input 52 has a small capacitance value, which is effectively equal to connecting a small capacitor from the input of an "ideal" gate to circuit ground. The small capacitance 64 develops in the metal oxide to substrate junction, which produces the gate structure. This small capacitance 64 is used in place of the second capacitor 50. Therefore, the apparent two-pole filter 62 delivers three-pole frequency response.

Not only does this filter 62 eliminate the need for the second capacitor, thus cutting circuit cost, but it displays very negligible phase shift from the first terminal of the first capacitor 44 to the input to the gate input 52. Since the gate capacitance 64 is very small, around 5 to 10 picofarads, a smaller first capacitor 44 is used with little degradation of filtering capability. Furthermore, the small capacitances produce an almost ideal filter 62 which displays a negligible phase shift. This embodiment offers less costly circuits and better performance, as compared to any of the other filters described herein.

INDUSTRIAL APPLICABILITY

A staggering variety of uses have been found for electronic circuits. Many of these uses involve "noisy" environments. "Noise", such as vibrations, radiation, and power surges, causes malfunctions in electronic circuits. Mounting and filtering arrangements must be devised to solve such problems.

An engine control, for example, must function in a very hostile environment. A central control unit is usually mounted somewhere in the engine compartment of a vehicle. Sensors, which send data on transmission lines to the central control, are routed to various locations in and around the engine to monitor critical parameters. The central control needs accurate data in order to perform its function correctly. However, electromagnetic radiation from a number of sources such as radios, CBs, and other controls, contaminates the data signals on the transmission lines.

Filtering the data signals at the central control is necessary to "clean up" the data signal. This task becomes increasingly difficult, since higher frequency digital signals are being used to transmit a greater amount of information. The electromagnetic interference filter, described earlier in this specification, allows the high frequency digital signals to pass, while it attenuates the higher frequency radio wave interference. When a contaminated digital signal is received by the filter, the inductor provides a low impedance path to the digital frequency, and it provides a high impedance path to the radio frequencies. Conversely, the capacitances provide a high impedance path to the digital frequency, and they provide a low impedance path to the radio frequencies. Therefore, as the inductor blocks the radio frequencies from the control, the capacitors freely transmit the radio frequencies to the circuit ground where they dissipate.

Resultantly, the control receives the digital signal substantially as sent from the sensor. Since the electromagnetic interference filter adds only one element, an inductor, to existing radio frequency filters, it is a cost effective solution.

Other aspects, objects, and advantages of this invention can be obtained from a study of the drawings, the disclosure, and the appended claims.

We claim:

1. An apparatus for filtering a digital input signal, comprising:
   a current limiting resistor having first and second terminals, said first terminal for receiving said digital signal;
   an inductor having first and second terminals, said first terminal being connected to the second terminal of said resistor and forming a junction;
   a capacitor having a first terminal connected to the junction of said resistor and inductor, and having a second terminal connected to a circuit ground; and
   a metal oxide semiconductor gate having an input connected only to the second terminal of said inductor.

2. The apparatus, as set forth in claim 1, wherein digital input signals are receivable on the first terminal of said current limiting resistor.

3. The apparatus as set forth in claim 1, wherein said inductor inhibits radio frequency radiation transmission.

4. The apparatus, as set forth in claim 3, wherein said inductor, upon reception of radio frequency radiation, attains a sufficiently high impedance to inhibit transmission of the radio frequency radiation to said metal oxide semiconductor gate input.

5. The apparatus, as set forth in claim 1, wherein said capacitor transmits radio frequency radiation to the circuit ground.

6. The apparatus, as set forth in claim 5, wherein said capacitor, upon reception of radio frequency radiation, attains a sufficiently low impedance to transmit the radio frequency radiation to the circuit ground.

7. The apparatus, as set forth in claim 1, wherein said capacitor, upon the reception of radio frequency radiation, attains an impedance sufficiently lower than the impedance of said inductor so that said capacitor transmits substantially all of the radio frequency radiation to circuit ground.

8. The apparatus, as set forth in claim 1, wherein said metal oxide semiconductor gate input includes a capacitance between the gate input and the circuit ground.

9. The apparatus, as set forth in claim 8, wherein said capacitance further attenuates radio frequency radiation.

10. The apparatus, as set forth in claim 1, wherein said capacitor prevents a phase shift between the first terminal of said resistor and the metal oxide semiconductor gate input.

11. The apparatus, as set forth in claim 8, wherein said capacitor and said capacitance, upon recepton of radio frequency radiation, attain a sufficiently low impedance to transmit the radio frequency radiation to the circuit ground.

* * * * *